US010203495B1

United States Patent
Sakai et al.

(10) Patent No.: US 10,203,495 B1
(45) Date of Patent: Feb. 12, 2019

(54) VIA UNDER INSULATED NOTCH OF ELECTROWETTING DISPLAY DEVICE

(71) Applicant: AMAZON TECHNOLOGIES, INC., Seattle, WA (US)

(72) Inventors: Toru Sakai, Waalre (NL); Gor Manukyan, Veldhoven (NL); Jozef Elisabeth Aubert, Roermond (NL); Abhishek Kumar, Tilburg (NL)

(73) Assignee: Amazon Technologies, Inc., Seattle, WA (US)

(*) Notice: Subject to any disclaimer, the term of this patent is extended or adjusted under 35 U.S.C. 154(b) by 5 days.

(21) Appl. No.: 15/087,474

(22) Filed: Mar. 31, 2016

(51) Int. Cl.
    *G02B 26/00* (2006.01)
    *H01L 27/12* (2006.01)
    *H01L 29/786* (2006.01)

(52) U.S. Cl.
    CPC ........ *G02B 26/005* (2013.01); *H01L 27/1218* (2013.01); *H01L 27/1222* (2013.01); *H01L 27/1248* (2013.01); *H01L 27/1259* (2013.01); *H01L 29/78669* (2013.01)

(58) Field of Classification Search
    CPC ......... G02F 1/134363; G02F 1/136227; G02F 1/136286; G02F 1/1368; G02F 2001/13629; G02F 1/1362; G02F 2001/136231; G02F 1/13439; G02F 2001/134372; G02F 1/133512; G02F 1/1339; G02F 1/133345; G02F 1/133555; G02F 2001/13685; G02F 1/134309

USPC ................ 359/237, 242, 265–267, 271–273, 359/290–292, 295, 296, 298, 315, 321, 359/322

See application file for complete search history.

(56) References Cited

U.S. PATENT DOCUMENTS

| | | | |
|---|---|---|---|
| 7,282,855 B2 * | 10/2007 | Park ..................... | H01L 27/3244 313/500 |
| 2005/0270465 A1 * | 12/2005 | Chae .................. | G02F 1/134363 349/141 |
| 2012/0147284 A1 * | 6/2012 | Kim .................. | G02F 1/133555 349/43 |
| 2013/0264595 A1 * | 10/2013 | Hong ..................... | G02B 26/02 257/91 |
| 2013/0301108 A1 * | 11/2013 | Lim ..................... | G02B 26/005 359/290 |

* cited by examiner

*Primary Examiner* — Brandi Thomas
(74) *Attorney, Agent, or Firm* — EIP US LLP (57) ABSTRACT

A display device includes a first support plate and an opposing second support plate. A pixel region is positioned between the first support plate and the second support plate. A thin film transistor (TFT) structure is formed on the first support plate and associated with the pixel region. The TFT structure includes a source and drain electrode layer. A reflective layer is formed or disposed over the source and drain electrode layer. The reflective layer includes a pixel electrode within the pixel region. A via is between the source and drain electrode layer and the reflective layer to electrically couple the pixel electrode to the source and drain electrode layer. An organic layer is formed or disposed over the via. The organic layer includes an elevated surface over the via.

13 Claims, 8 Drawing Sheets

VIA UNDER INSULATED NOTCH OF ELECTROWETTING DISPLAY DEVICE

BACKGROUND

Many portable electronic devices include displays for displaying various types of images. Examples of such displays include electrowetting displays (EWDs), liquid crystal displays (LCDs), electrophoretic displays (EPDs), and light emitting diode displays (LED displays). In EWD applications, a plurality of pixel regions are defined between first and second support plates that are coupled together. A pixel within each of the plurality of pixel regions is generally defined by pixel walls. Each pixel is opened or closed based upon motion of electrowetting fluids within the associated pixel region. With EWDs, it is desirable to control the motion of the electrowetting fluids within the pixel regions such that the associated pixels open and/or close in the same manner, e.g., the pixels open and/or close at a same opening or initiation point.

BRIEF DESCRIPTION OF THE DRAWINGS

The detailed description includes reference to non-limiting and non-exhaustive embodiments illustrated in the accompanying figures. The same reference numerals in different figures refer to similar or identical items.

DETAILED DESCRIPTION

The present disclosure provides arrangements and techniques for controlling motion of an electrowetting oil within an electrowetting display device.

As described below, within an electrowetting display device, pixel regions having an insulated notch configuration include a via that provides coupling between a top metal layer, e.g., a reflective layer including a pixel electrode, and a metal layer of a thin film transistor (TFT) structure associated with the pixel region for applying a voltage within the pixel region. More specifically, in certain configurations, a via is formed through a passivation layer, for example, a silicon nitride layer, such that the reflective layer positioned on a first side, e.g., on a top surface, of the passivation layer contacts or is electrically coupled to a metal layer, e.g., a source and drain electrode layer of the TFT structure, positioned on a second side, e.g., a bottom surface, of the passivation layer opposite the first side. In certain conventional configurations, the via is positioned within the pixel region such that a first electrowetting fluid, e.g., a liquid such as an electrowetting oil, in an active pixel region will form in a droplet over the via. In some conventional pixel configurations, the layers deposited over the via are relatively thin, for example, between 100 nanometers and 200 nanometers in thickness. As a result, the deposited layers may not provide an optimal planarization layer forming a smooth bottom surface of a pixel within the pixel region but, rather, will form an indentation or dimple over the via, which may undesirably affect the movement of electrowetting fluids across the bottom surface of the pixel. Moreover, the via may undesirably act as a secondary opening or initiation point for the electrowetting oil, disrupting the desired oil movement within the pixel.

For example, within a pixel having a conventional insulated notch configuration, a dielectric layer has a relative higher dielectric constant than the electrowetting oil within the associated pixel. As voltage is applied to the associated pixel, a voltage drop near the dielectric layer is less than a voltage drop in other portions of the associated pixel, providing the opening or initiation point. As the pixel opens, the oil moves toward a pixel wall, for example, near the via. However, the dimple formed in the layers overlying the via may provide a secondary initiation point counteracting the primary initiation point. The secondary initiation point may cause at least some of the oil to move in a direction opposite the intended direction of movement, e.g., away from the via toward the primary initiation point.

Accordingly, in the example embodiments described herein, the via is positioned under an elevated area or surface of the pixel forming the primary initiation point. In this position, a polymer material, e.g., a suitable photoresist material, forms a planarization layer having a thickness of about 1.0 micrometer to 2.0 micrometers, for example, to cover the via without forming a dimple. By positioning the via under the elevated surface forming the primary initiation point, any secondary initiation point is essentially removed and motion of the oil within the pixel is enhanced. Additionally, the polymer planarization layer provides for a smooth bottom surface of the associated pixel to facilitate oil movement.

Generally, image display apparatuses, such as, for example, various electronic devices, including, without limitation, portable computing devices, tablet computers, laptop computers, notebook computers, mobile phones, personal digital assistants (PDAs), and portable media devices (e.g., electronic book ("eBook") readers and DVD players), display images on a display. Examples of such displays include, without limitation, LCDs, EWDs and EPDs.

In various embodiments described herein, electronic devices, e.g., electrowetting display devices, include displays, e.g., electrowetting displays, for presenting content and other information. In some examples, the electrowetting display devices may include one or more components associated with the electrowetting display, such as a touch sensor component layered atop the electrowetting display for detecting touch inputs, a front light or a back light component for lighting the electrowetting display, and/or a cover layer component, which may have antiglare properties, antireflective properties, anti-fingerprint properties, anti-cracking properties, and/or the like. Various embodiments described herein include techniques for assembling electrowetting display devices including these components for the electrowetting displays and other features described herein.

An electrowetting pixel region includes a number of pixel walls that surround or are otherwise associated with at least a portion of the electrowetting pixel region, e.g., at least partially forming a pixel or a sub-pixel within the pixel region. The pixel walls form a structure that is configured to contain at least a portion of a first fluid, e.g., a liquid such as an opaque oil. Light transmission through the electrowetting pixel region can then be controlled by the application of an electric potential to the electrowetting pixel region, which results in a movement of a second fluid, e.g., a liquid such as a liquid electrolyte solution, into the electrowetting pixel, thereby displacing the first fluid. A pixel region may, unless otherwise specified, include an electrowetting element, one or more pixels, one or more pixels each including a plurality of sub-pixels, or one or more sub-pixels of an electrowetting display device, for example. Such an electrowetting element, pixel or sub-pixel may be the smallest light transmissive, reflective or transflective component of an electrowetting display that is individually operable to directly control an amount of light transmission through and/or reflection from the pixel region. For example, in some implementations, a pixel region may include a plurality of pixels, wherein each pixel includes a red sub-pixel, a green sub-pixel, a blue sub-pixel, and a white sub-pixel. In other implementations, a pixel region may include a plurality of pixels, wherein each pixel is a smallest component of the electrowetting display, i.e., the pixel does not include any sub-pixels.

An electronic display device, such as an electrowetting display device, may have a transmissive, reflective or transflective display that generally includes an array of pixel regions (e.g., which may comprise pixels and/or sub-pixels) configured to be operated by an active matrix addressing scheme. For example, rows and columns of electrowetting pixel regions are operated by controlling voltage levels on a plurality of source lines and a plurality of gate lines. In this configuration, the electronic display device may produce an image by selecting particular pixel regions to transmit, reflect or block light. Pixel regions are addressed (e.g., selected) via rows of source lines and columns of gate lines that are electrically connected to transistors (e.g., used as switches) included in each pixel region. Transistors take up a relatively small fraction of the area of each pixel region to allow light to efficiently pass through (or reflect from) the pixel region.

Electrowetting displays include an array of pixel regions sandwiched between two support plates, such as a first or bottom support plate and a second or top support plate. For example, a bottom support plate in cooperation with a top support plate may contain pixel regions that include a liquid electrowetting oil, a liquid electrolyte solution, and one or more pixel walls between the support plates. The support plates may be made of a suitable glass, plastic, or other transparent material and may be rigid or flexible, for example. Generally, a material or layer is "transparent" if the material or layer transmits a relatively large fraction of the light incident upon it. For example, a transparent material or layer may transmit more than 70% and, more particularly, more than 80% of the light impinging on its surface, though claimed subject matter is not limited in this respect. The pixel regions include various layers of materials built on or over the bottom support plate. One example layer is an amorphous fluoropolymer (AF) with hydrophobic behavior, on or around portions of which pixel walls are built in certain embodiments.

Hereinafter, example embodiments include, but are not limited to, reflective electrowetting displays that include a clear or transparent top support plate and a bottom support plate, which need not be transparent, e.g., made of an opaque material. The terms "top" and "bottom" are generally used to identify the opposing support plates of an electrowetting display device, and do not necessarily refer to a direction referenced to gravity or to a viewing side of the electrowetting display device. Also, for the sake of convenience of describing example embodiments, the top support plate is the surface through which the pixel regions of a (reflective) electrowetting display are viewed.

In certain embodiments, individual reflective electrowetting pixel regions include a thin film transistor (TFT) structure formed or disposed on or over the bottom support plate. The TFT structure includes a reflective layer, and a hydrophobic layer is formed on or over the reflective layer. The pixel walls of each pixel, the hydrophobic layer, and the transparent top support plate at least partially enclose a fluid region or cavity. Within the fluid region, a first fluid, e.g., an electrically non-conductive first liquid, such as an opaque oil, is retained in the individual electrowetting pixels by the pixel walls. A second fluid, e.g., a second liquid, overlies the first liquid and may overlie some of the pixel walls of the patterned pixel region grid. In certain embodiments, the second liquid is a liquid electrolyte solution that is electrically conductive or polar and may be a water or a salt solution, such as a solution of potassium chloride in water. The second liquid may be transparent, or may be colored or light-absorbing. The second liquid is immiscible with the first liquid. In general, substances are immiscible with one another if the substances do not substantially form a solution, although in a particular embodiment, the second liquid might not be perfectly immiscible with the first liquid. In general, an "opaque" liquid is a liquid that appears black to an observer. For example, an opaque liquid strongly absorbs a broad spectrum of wavelengths (e.g., including those of red, green and blue light) in the visible region of electromagnetic radiation appearing black. However, in certain embodiments, an opaque liquid may absorb a relatively narrower spectrum of wavelengths in the visible region of electromagnetic radiation and may not appear perfectly black.

In some embodiments, the opaque first liquid is a non-polar electrowetting oil. In certain embodiments, the first liquid may absorb at least a portion of the visible light spectrum. The first liquid may be transmissive for a portion of the visible light spectrum, forming a color filter. For this purpose, the first liquid may be colored by addition of pigment particles or a dye. Alternatively, the first liquid may be black, for example by absorbing substantially all portions of the visible light spectrum, or reflecting. A reflective first liquid may reflect the entire visible light spectrum, making the layer appear white, or a portion of the entire visible light spectrum, making the layer have a color. In example embodiments, the first liquid is black and, therefore, absorbs substantially all portions of an optical light spectrum, for example, in the visible light spectrum. The opaque liquid is disposed in the fluid region within individual pixels or sub-pixels. A coverage area of the opaque first liquid on the bottom hydrophobic layer is electrically adjustable to affect the amount of light incident on the reflective electrowetting display that reaches the reflective material at the bottom of each pixel or sub-pixel.

One or more spacers and one or more edge seals may also be located between the two support plates to at least partially enclose the fluid region. The spacers and the edge seals mechanically couple the first support plate with the opposing, overlying second support plate, and form a separation between the first support plate and the second support plate, as well as contribute to the mechanical integrity of the electrowetting display device. In example embodiments, the edge seals are disposed along a periphery of an array of electrowetting pixel regions, to facilitate retaining liquids (e.g., the first liquid and the second liquid) between the first support plate and the second support plate. The spacers can be at least partially transparent so as to not hinder throughput of light in the electrowetting display. The transparency of the spacers may at least partially depend on the refractive index of the spacer material, which in certain embodiments is similar to or the same as the refractive indices of surrounding media. The spacers may also be chemically inert to surrounding media.

In some embodiments, an electrowetting display as described herein may form a portion of a system that includes one or more processors and one or more computer memories, which may reside on a control board, for example. Display software may be stored on the one or more memories and may be operable with the one or more processors to modulate light that is received from an outside source (e.g., ambient room light) or out-coupled from a lightguide of the display device. For example, display software may include code executable by a processor to modulate optical properties of individual pixel regions of the electrowetting display based, at least in part, on electronic signals representative of a static image and/or video data. The code may cause the processor to modulate the optical properties of pixel regions by controlling electrical signals (e.g., voltages, currents, and fields) on, over, and/or in layers of the electrowetting display.

Figure 1:
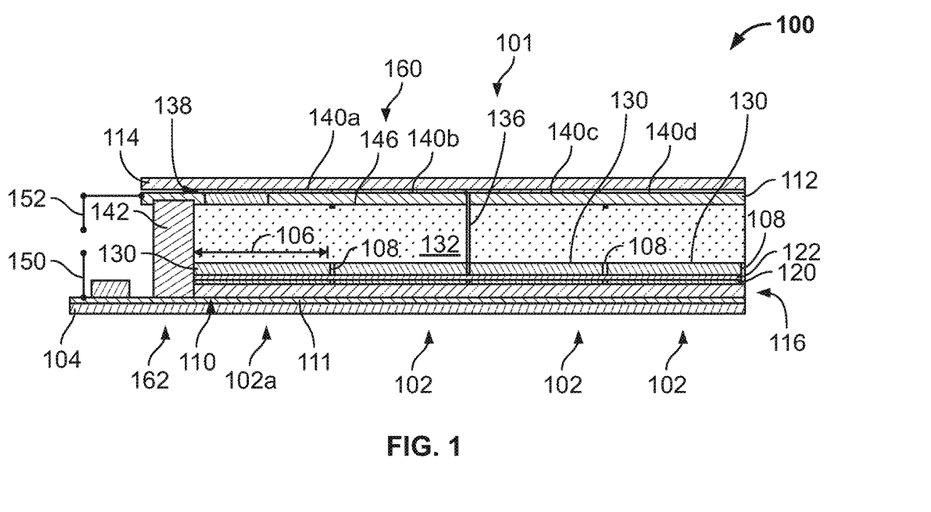
FIG. 1 is a cross-sectional view of an electrowetting display device, according to an example embodiment.
Figure 2:
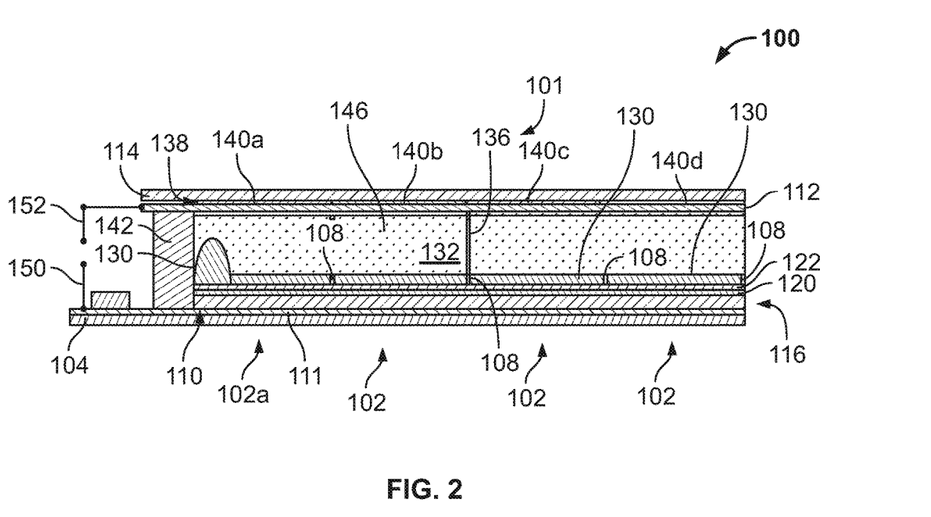
FIG. 2 is a cross-sectional view of the electrowetting display device of FIG. 1 with a first electrowetting pixel activated to expose at least a portion of a display area.
Figure 3:
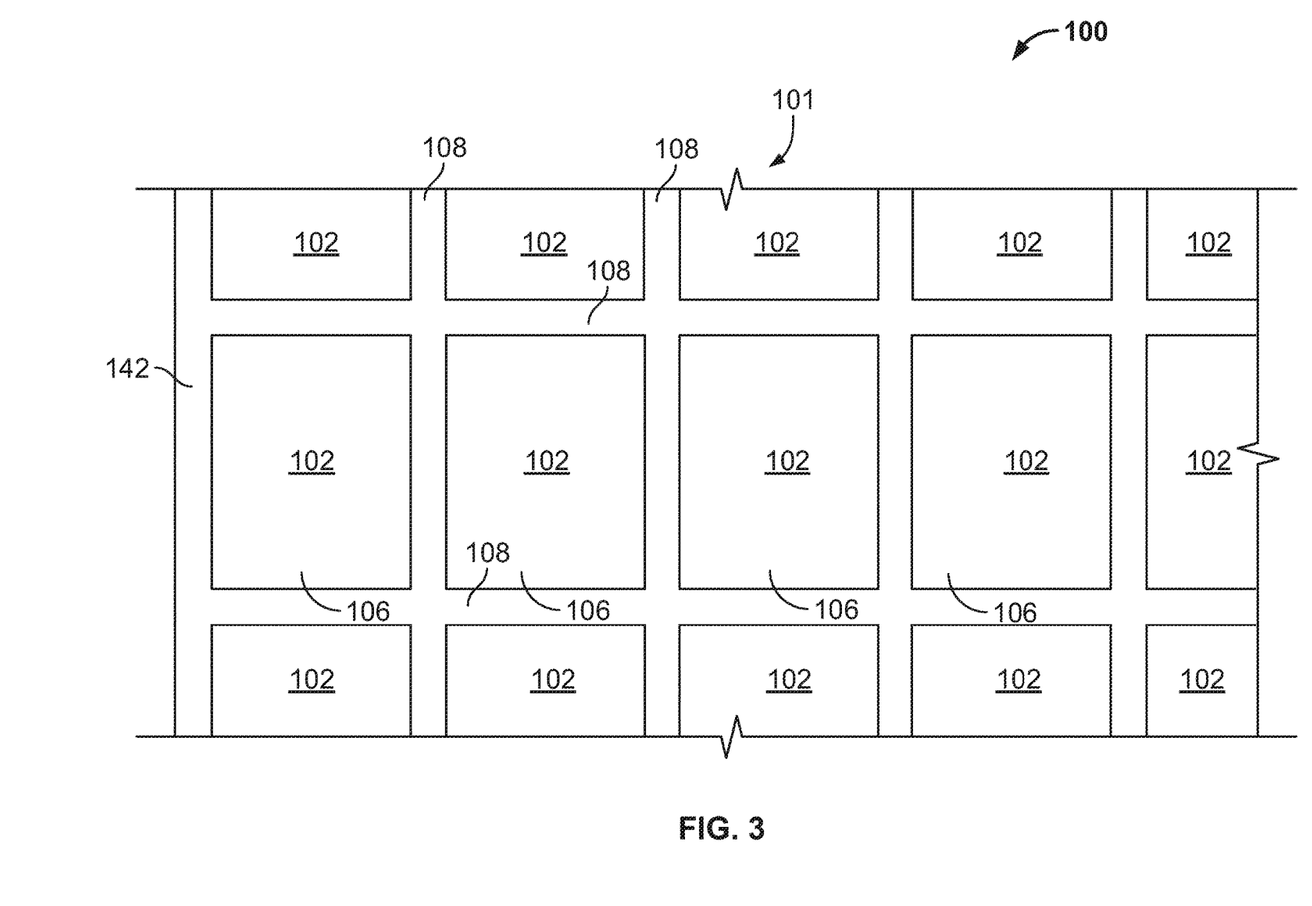
FIG. 3 is a top view of a plurality of electrowetting pixels of an electrowetting display device, according to an example embodiment.

Referring now to the figures, FIG. 1 is a cross-sectional view of a portion of an example reflective electrowetting display device 100 including a pixel grid 101 with several electrowetting pixels 102. FIG. 2 shows the same cross-sectional view as FIG. 1 in which an electric potential has been applied to one electrowetting pixel 102a causing displacement of a first liquid disposed in electrowetting pixel 102a, as described below. Four complete electrowetting pixels 102 are shown in cross-section in FIGS. 1 and 2. FIG. 3 is a top view of an example reflective electrowetting display device 100 including pixel grid 101 having a plurality of electrowetting pixels 102 formed over a first or bottom support plate 104 (shown in FIGS. 1 and 2). As shown in FIG. 3, each electrowetting pixel 102 defines a display surface area 106. More specifically, in this embodiment, display surface area 106 is defined by pixel walls 108, as described below, having a first dimension, such as a width, between opposing lateral pixel walls 108, and a second dimension, such as a length, between the remaining opposing pixel walls 108. Electrowetting display device 100 may include any number (usually a very large number, such as thousands or millions) of electrowetting pixels 102.

Referring further to FIGS. 1 and 2, a TFT structure 110 includes an electrode layer or a first metal layer 111, i.e., a gate electrode layer, having a plurality of pixel electrodes is formed on bottom support plate 104 and between electrowetting pixels 102 and bottom support plate 104. Electrode layer 111 and/or the one or more pixel electrodes are operatively coupled to a second or common electrode 112 positioned under a second or top support plate 114 for creating, in conjunction with common electrode 112, a voltage differential between electrode layer 111 and common electrode 112 to cause displacement of the first liquid, e.g., an oil, within the associated electrowetting pixel 102. These example embodiments are not limiting with respect to the location of the electrode layer and/or the pixel electrodes and the common electrode, and claimed subject matter is not limited in this respect. In particular embodiments, one or more additional layers may be positioned between electrode layer 111 and bottom support plate 104, or within or above electrode layer 111, in which TFTs, gates, and/or source lines are located, for example. In these embodiments, electrode layer 111 may not be formed directly on bottom support plate 104. In various embodiments, electrode layer 111 forms part of TFT structure 110, which can be switched to either select or deselect corresponding electrowetting pixel 102 using active matrix addressing, for example. A TFT is a particular type of field-effect transistor that includes thin films of an active semiconductor layer as well as a dielectric layer and metallic contacts over a supporting (but non-conducting) substrate, which may be glass or any suitable transparent or non-transparent material, for example.

In example embodiments, TFT structure 110 includes a reflective layer 116 including a pixel electrode is positioned on or over electrode layer 111, as shown in FIGS. 1 and 2, for example. In particular embodiments, one or more additional layers may be positioned between reflective layer 116 and electrode layer 111. In these embodiments, reflective layer 116 may not be formed directly on electrode layer 111. In an alternative embodiment, reflective layer 116 is positioned under a transparent electrode layer 111. In this alternative embodiment, reflective layer 116 is positioned between the transparent electrode layer 111 and bottom support plate 104. Reflective layer 116 may reflect light within the entire visible spectrum, making the layer appear relatively bright, or reflect a portion of light within the visible spectrum, making the layer have a color. In this embodiment, reflective layer 116 is positioned within the pixel region, e.g., within electrowetting pixel 102, to provide specular reflection.

In example embodiments, reflective layer 116 is positioned on or over electrode layer 111 within electrowetting pixel 102 or, alternatively, on or over electrode layer 111 and under electrowetting pixel 102. In certain embodiments, reflective layer 116 is formed or made of any suitable materials including, for example, a metal (90%, 95% or greater than 95% metal), an alloy, a doped metal, or a dielectric reflective material. Suitable metal materials for reflective layer 116 include, without limitation, aluminum, silver, gold, copper, nickel, platinum, rhodium, lanthanum, and/or silicon nickel. Suitable alloy materials for reflective layer 116 include, without limitation, aluminum with copper or aluminum with nickel. In further alternative embodiments, reflective layer 116 is made of any suitable material providing a desired specular reflectance. In alternative embodiments, reflective layer includes a suitable diffuse reflective material deposited on or over electrode layer 111. In this alternative embodiment, any suitable diffuse reflective material, such as titanium dioxide ($TiO_2$), providing a desired diffuse reflectance may be used. Electrowetting pixels 102 may have specific and/or additional structural features. Additionally or alternatively, reflective layer 116 may have structural features, for example, one or more relatively thinner areas and/or one or more relatively thicker areas within reflective layer 116 to control movement of the fluids. Alternatively, reflective layer 116 may be deposited on a structural feature conforming to a shape of the structural feature.

As shown in FIGS. 1 and 2, a suitable dielectric barrier layer 120 may at least partially separate electrode layer 111 from a hydrophobic layer 122, such as an amorphous fluoropolymer layer forming a bottom surface of electrowetting pixel 102 in certain embodiments. For example, dielectric barrier layer 120 may be disposed on, e.g., deposited on, reflective layer 116. Dielectric barrier layer 120 may be formed from various materials including one or more organic material layers or a combination of organic and inorganic material layers. A thickness of the insulating dielectric barrier layer 120 may be less than 2 micrometers and may be less than 1 micrometer; for example, the insulating dielectric barrier layer 120 may be 100 nanometers to 800 nanometers in thickness in certain embodiments. In some embodiments, hydrophobic layer 122 is an amorphous fluoropolymer layer including any suitable fluoropolymer(s), such as AF1600® fluoropolymer, produced by DuPont, based in Wilmington, Del. Hydrophobic layer 122 is transparent in the example embodiment. As described above, in certain embodiments, reflective layer 116 can act both as a pixel electrode and a reflective layer.

In the example embodiment, one or more pixel walls 108 form patterned electrowetting pixel grid 101 on hydrophobic layer 122. Pixel walls 108 may include a photoresist material such as, for example, an epoxy-based negative photoresist material SU-8. Patterned electrowetting pixel grid 101 includes a plurality of rows and a plurality of columns that form an array of electrowetting pixels, such as shown in FIG. 3, including a plurality of electrowetting pixels 102 that may have a width and a length in a range of about 50 to 500 micrometers, for example.

A first liquid 130, which may have a thickness (e.g., a height as shown in FIGS. 1 and 2 for example) in a range of about 1 micrometer to 10 micrometers, for example, overlays hydrophobic layer 122. First liquid 130 is partitioned by pixel walls 108 of patterned electrowetting pixel grid 101. A second liquid 132, such as an electrolyte solution, overlays first liquid 130 and, in certain embodiments, at least a portion of pixel walls 108 of patterned electrowetting pixel grid 101. In certain embodiments, as described above, second liquid 132 may be electrically conductive and/or polar. For example, second liquid 132 may be water or a water solution, or a salt solution such as a solution of potassium chloride in water or a mixture of water and ethyl alcohol. In certain embodiments, second liquid 132 is transparent, but may be colored or absorbing. First liquid 130 is electrically non-conductive and may, for example, be an alkane-like hexadecane or (silicone) oil. As described above, second liquid 132 is immiscible with first liquid 130.

As described above, hydrophobic layer 122 is arranged on or over bottom support plate 104 to create an electrowetting surface area. The hydrophobic character of hydrophobic layer 122 causes first liquid 130 to adjoin preferentially to hydrophobic layer 122 because first liquid 130 has a higher wettability with respect to a top surface of hydrophobic layer 122 than second liquid 132 in the absence of a voltage. Wettability relates to the relative affinity of a fluid, e.g., a liquid, for the surface of a solid. Wettability increases with increasing affinity, and it may be measured by the contact angle formed between the fluid and the solid and measured internal to the fluid of interest. For example, such a contact angle may increase from relative non-wettability for a contact angle of more than 90° to complete wettability for a contact angle of 0°, in which case the liquid tends to form a film on the surface of the solid.

Top support plate 114 covers second liquid 132 and one or more spacers 136 to maintain second liquid 132 over electrowetting pixel grid 101. In one embodiment, spacers 136 are positioned between top support plate 114 and pixel wall 108. In example embodiments, spacer 136 is coupled to and extends from top support plate 114 to contact one or more corresponding pixel walls 108. In certain embodiments, one or more components or layers may be positioned between top support plate 114 and spacers 136. In alternative embodiments, spacer 136 does not rest on pixel wall 108 but is substantially aligned with pixel wall 108. This arrangement may allow spacer 136 to come into contact with pixel wall 108 upon a sufficient pressure or force being applied to top support plate 114. Multiple spacers 136 may be interspersed throughout electrowetting pixel grid 101. In certain embodiments, one or more filter layers 138 including, for example, color filters 140a-140d as shown in FIGS. 1 and 2, may be positioned between second electrode 112 and top support plate 114. A seal 142 extends about a perimeter of electrowetting display device 100 to contain first liquid 130 and second liquid 132 within the fluid region. A voltage applied across, among other things, second liquid 132 and electrode layer 111 of individual electrowetting pixels 102 controls transmittance or reflectance of the individual electrowetting pixels 102. Electrode layer 111 is separated from first liquid 130 and second liquid 132 by an insulator, which may be hydrophobic layer 122. Electrode layer 111 (and thereby the pixel electrodes) is supplied with voltage signals V by a first signal line 150. A second signal line 152 is electrically coupled to common electrode 112 in contact with conductive second liquid 132. Thus, common electrode 112 may be common to more than one electrowetting pixel region because the electrowetting regions are generally fluidly interconnected by and share second liquid 132 uninterrupted by pixel walls 108. In embodiments where pixel walls 108 extend to top support plate 114, second liquid 132 might not be shared where pixel walls 108 surround each electrowetting pixel 102 without openings in pixel walls 108 through which second liquid 132 may flow. Electrowetting pixels 102 are controlled by the voltage V applied between first signal line 150 and second signal line 152, as described in reference to FIG. 4.

Reflective electrowetting display device 100 has a viewing side 160 corresponding to top support plate 114 through which an image formed by reflective electrowetting display device 100 may be viewed, and an opposing rear side 162 corresponding to bottom support plate 104 as shown, for example, in FIGS. 1 and 2. Reflective electrowetting display device 100 may be a segmented display type in which the image is built of segments. The segments may be switched simultaneously or separately. Each segment includes one electrowetting pixel 102 or a number of electrowetting pixels 102 that may be neighboring or distant from one another. Electrowetting pixels 102 included in one segment are switched simultaneously, for example. Electrowetting display device 100 may also be an active matrix driven display type or a passive matrix driven display, for example.

Figure 4:
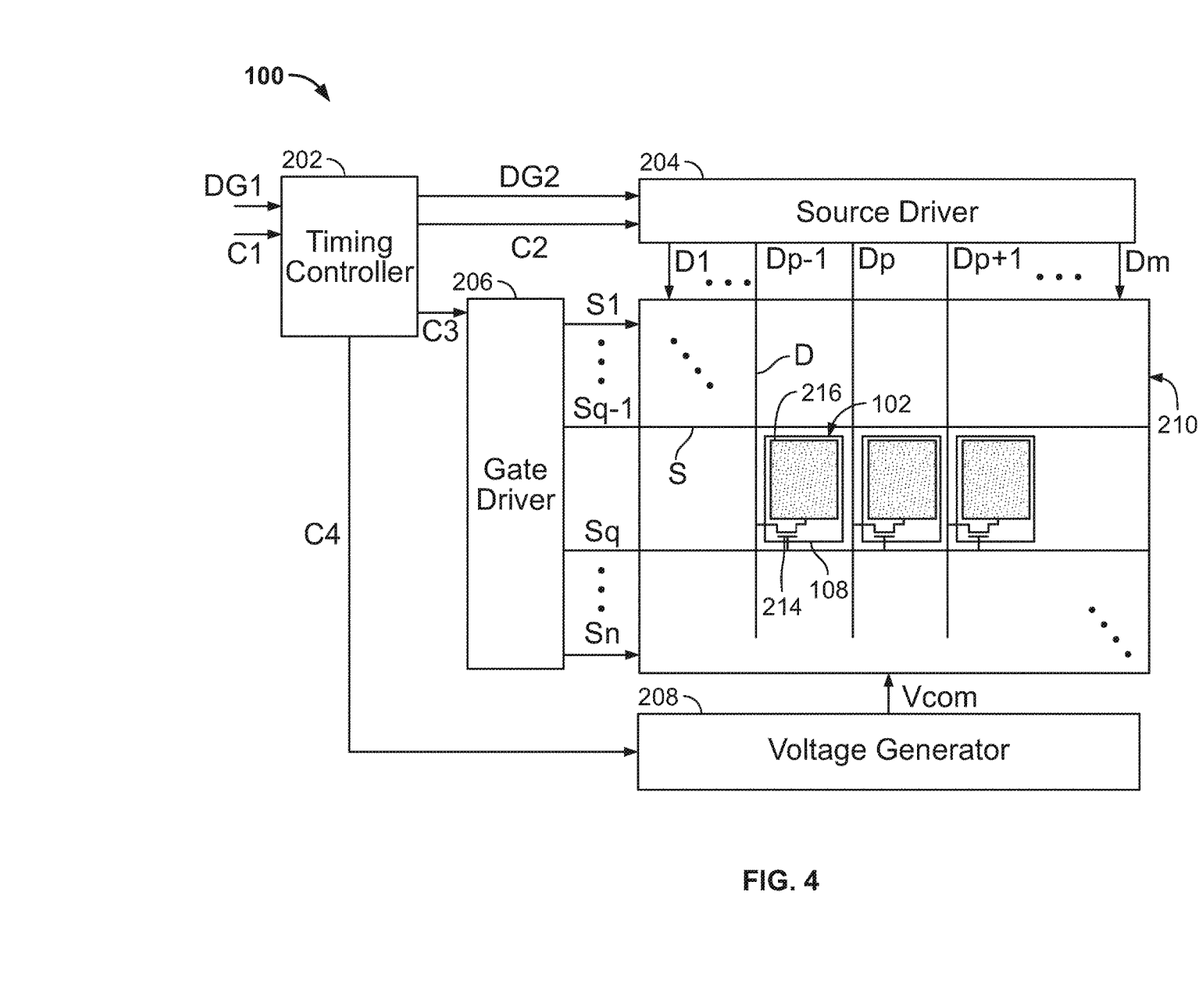
FIG. 4 is a schematic view of an electrowetting display device, according to an example embodiment.

Referring to FIG. 4, electrowetting display device 100 is schematically illustrated that includes a timing controller 202, a source driver (data driver) 204, a gate driver (scan driver) 206, a voltage generator 208, and an electrowetting display panel 210. Electrowetting display panel 210 is driven by timing controller 202, source driver 204, gate driver 206, and voltage generator 208.

As an example of general operation of electrowetting display device 100, responsive to a first data signal DG1 and a first control signal C1 from an external source, e.g., a graphic controller (not illustrated), timing controller 202 applies a second data signal DG2 and a second control signal C2 to source driver 204; a third control signal C3 to gate driver 206; and a fourth control signal C4 to voltage generator 208.

Source driver 204 converts second data signal DG2 to voltages, i.e., data signals, and applies data signals D1, . . . , Dp−1, Dp, Dp+1, . . . , Dm to electrowetting display panel 210. Gate driver 206 sequentially applies scan signals S1, . . . , Sq−1, Sq, . . . , Sn to electrowetting display panel 210 in response to third control signal C3. Voltage generator 208 applies a common voltage Vcom to electrowetting display panel 210 in response to fourth control signal C4. Although not illustrated in FIG. 4, voltage generator 208 generates various voltages required by timing controller 202, source driver 204, and gate driver 206. Electrowetting display panel 210 includes m data lines D, i.e., source lines, to transmit data voltages and n gate lines S, i.e., scan lines, to transmit a gate-on signal.

Electrowetting pixels 102 are positioned adjacent to crossing points of data lines D and gate lines S crossing data lines D and thus are arranged in a grid of rows and columns. Each electrowetting pixel 102 includes a hydrophobic surface (not illustrated in FIG. 4), and a thin film transistor 214 and a pixel electrode 216 under the hydrophobic surface. Each electrowetting pixel 102 may also include a storage capacitor (not illustrated) under the hydrophobic surface.

A voltage V applied across second fluid 132 and the dielectric barrier layer stack (e.g., hydrophobic layer 122) of individual electrowetting pixels 102 can control transmittance or reflectance of individual electrowetting pixels 102. With electrowetting pixel 102 in an active state, electrostatic forces will move second fluid 132 toward electrode layer 111, thereby repelling first fluid 130 from an area of hydrophobic layer 122 to pixel walls 108 surrounding the area of hydrophobic layer 122, to a droplet-like shape. This action uncovers first fluid 130 from the surface of hydrophobic layer 122 of electrowetting pixel 102. When voltage across electrowetting pixel 102 is returned to an inactive signal level of zero volts or a value near to zero volts, electrowetting pixel 102 will return to an inactive state, where first fluid 130 flows back to cover hydrophobic layer 122. In this way, first fluid 130 forms an electrically controllable optical switch in each electrowetting pixel 102.

Generally, thin film transistor 214 includes a gate electrode that is electrically connected to a corresponding scan line of scan lines S, a source electrode that is electrically connected to a corresponding data line (e.g., first signal line 150 of FIGS. 1 and 2) of data lines D, and a drain electrode that is electrically coupled to pixel electrode 216. Thus, electrowetting pixels 102 are operated, i.e., driving of electrowetting display device 100, based upon scan lines S and data lines D of FIG. 4.

Figure 5:
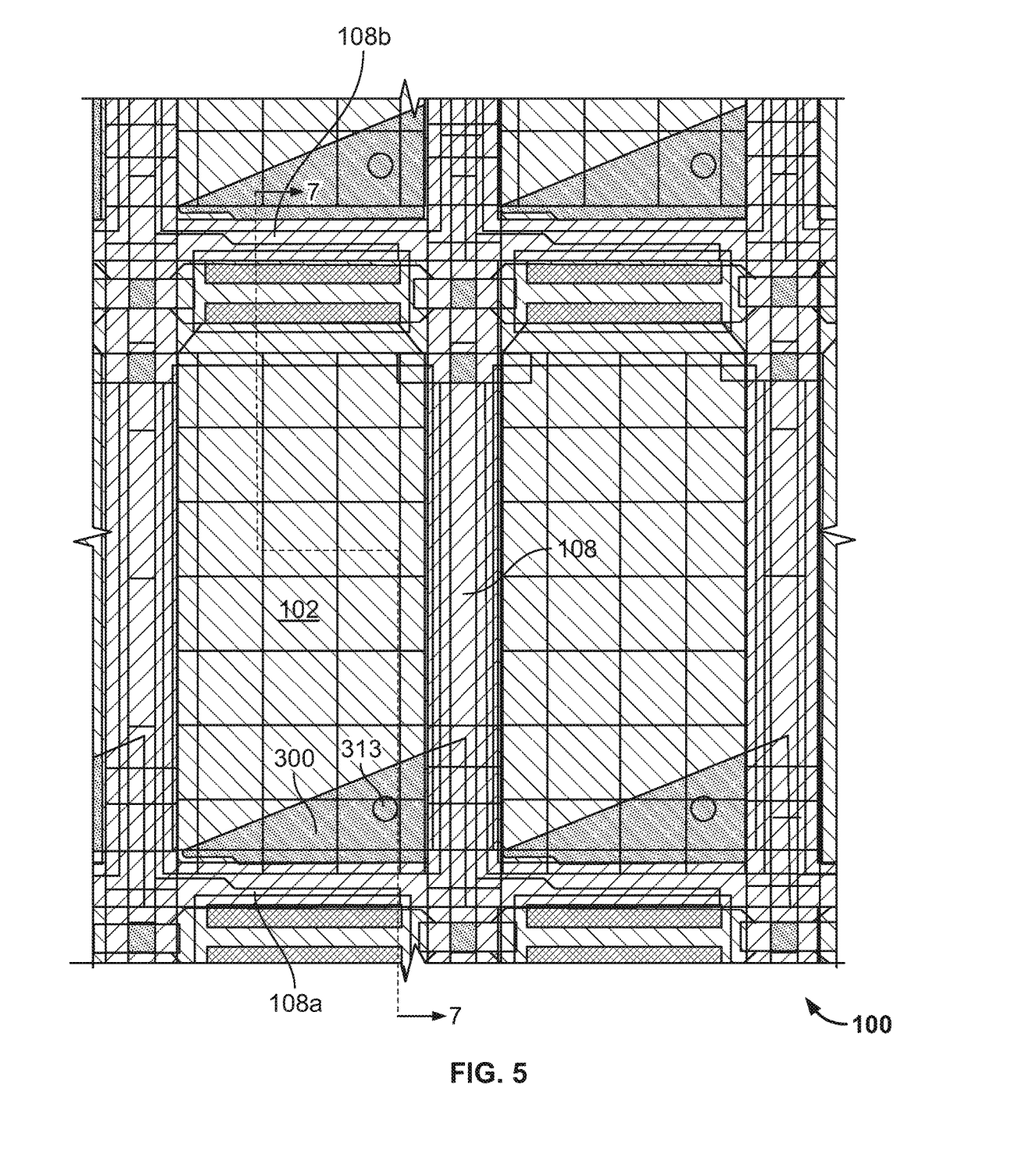
FIG. 5 is a top view of an electrowetting pixel region of an electrowetting display device, according to an example embodiment.
Figure 6:
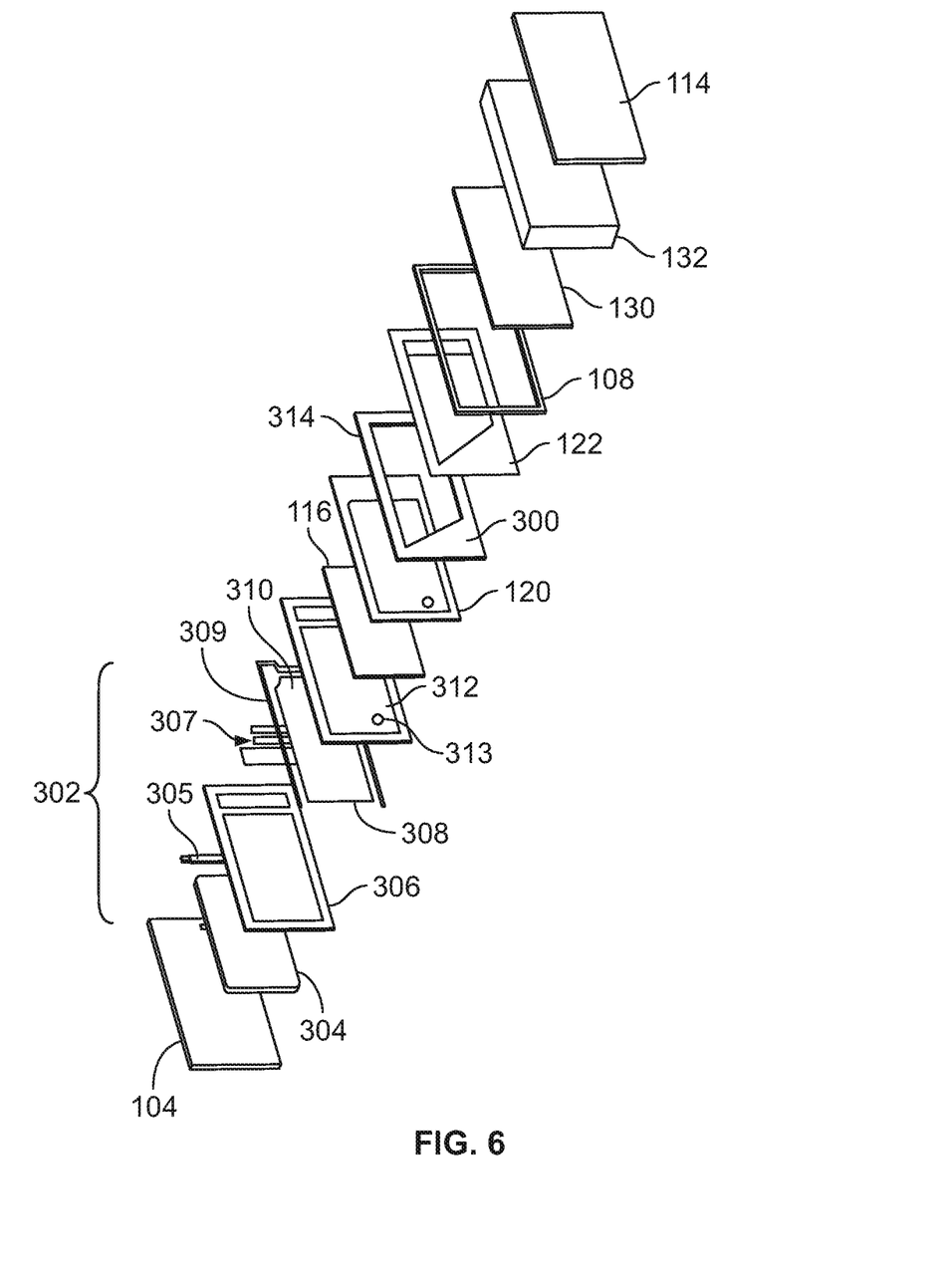
FIG. 6 is an exploded view of the electrowetting pixel region of FIG. 5.
Figure 7:
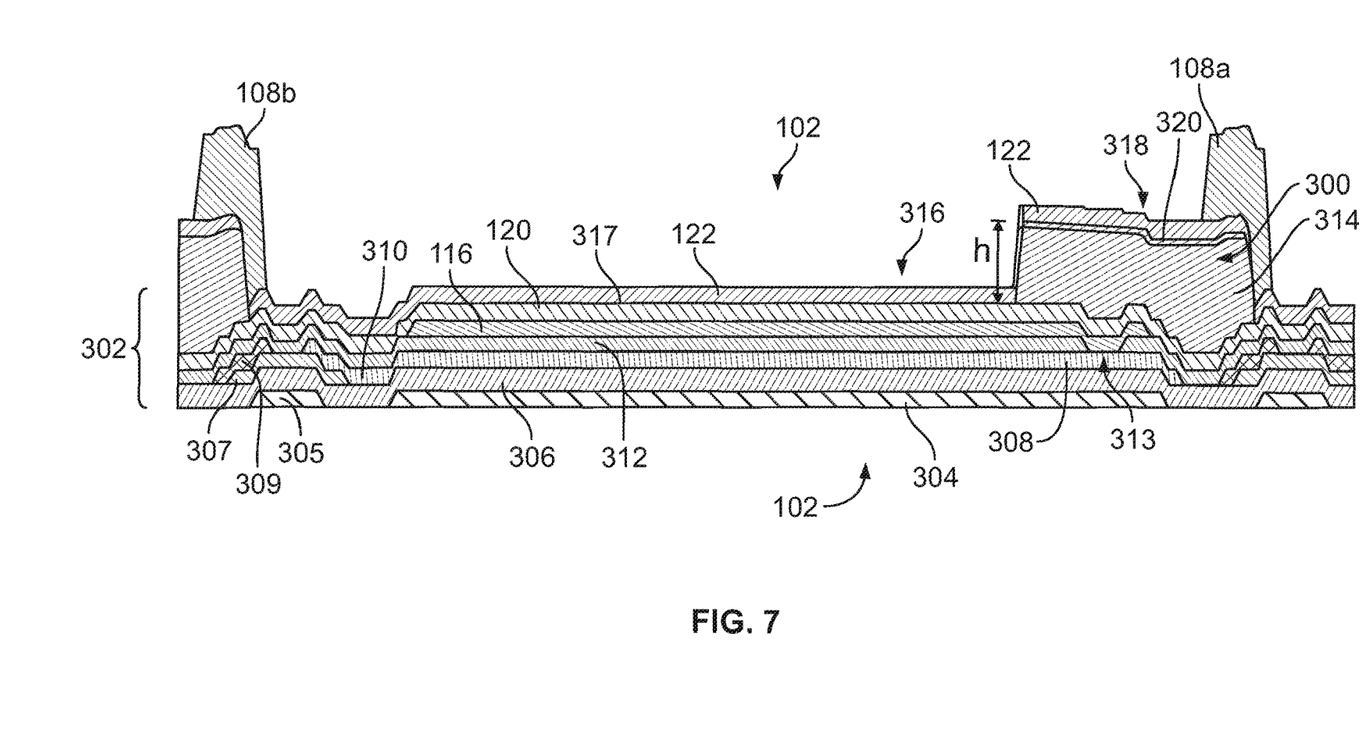
FIG. 7 is a cross-sectional view of the electrowetting pixel region of FIG. 5 along sectional line 7-7.

Referring further to FIGS. 5-7, in example embodiments, a display device, such as electrowetting display device 100, includes a plurality of pixel regions, e.g., electrowetting pixel regions, formed over first or bottom support plate 104. Each pixel region includes a pixel, e.g., an electrowetting pixel 102, having an elevated area or surface 300. In example embodiments, elevated surface 300 forms a primary initiation point. Referring further to FIGS. 5 and 7, when voltage is applied to electrowetting pixel 102 as previously described herein, the wetting properties of hydrophobic layer 122 forming the bottom surface of electrowetting pixel 102 are modified so that second liquid 132 (not shown in FIGS. 5 and 7) has a greater affinity for hydrophobic layer 122. Such modification causes electrowetting oil 130 to "break" at the primary initiation point and move towards pixel wall 108a at an opposite end of electrowetting pixel 102 away from elevated surface 300. Second liquid 132 becomes attracted to hydrophobic layer 122 and generally displaces electrowetting oil 130, as previously described. Thus, electrowetting pixel 102 "opens" from elevated surface 300 towards pixel wall 108a. Moreover, in contrast to some conventional electrowetting pixel configurations, because via 313, described below, is positioned under elevated surface 300, no secondary initiation point exists that might adversely affect the movement of first liquid 130 toward pixel wall 108a, i.e., create a secondary initiation point for oil movement in a direction toward elevated surface 300.

As shown for example in FIGS. 5 and 7, a portion of pixel wall 108 at least partially forming electrowetting pixel 102 is positioned over a portion of elevated surface 300 in certain embodiments. In the example embodiment, a first pixel wall or pixel wall portion at least partially forms electrowetting pixel 108, e.g., pixel wall 108a. Pixel wall 108a is positioned over a portion of elevated surface 300. Elevated surface 300 is positioned adjacent pixel wall 108a and a TFT structure 302, as described below, is positioned adjacent a second pixel wall or second pixel wall portion, e.g., pixel wall 108b, opposite first pixel wall 108a. Elevated surface 300 may have any suitable shape, dimensions and/or configuration. For example, in the example embodiment shown in FIGS. 5-7, elevated surface 300 has a triangular surface area and is positioned adjacent pixel wall 108a. In alternative embodiments, elevated surface 300 may have a rectangular surface area, for example, or another suitable shape.

A plurality of thin film transistors (TFT) structures 302 is formed on or over bottom support plate 104. In example embodiment, TFT structure 302 is the same or similar to TFT structure 110. Each TFT structure 302 is associated, e.g., electrically coupled to, a corresponding electrowetting pixel 102 within an associated pixel region. In example embodiments, TFT structure 302 is coupled in signal communication with associated electrowetting pixel 102 within the pixel region. TFT structure 302 is switched to either select (activate) or deselect (deactivate) associated electrowetting pixels 102 using active matrix addressing, for example. In example embodiments, TFT structure 302 includes a first metal layer, e.g., an electrode layer or gate electrode layer 304 that includes a gate 305 formed or disposed between pixel wall 108 and bottom support plate 104. As shown in FIG. 7, for example, gate electrode layer 304 is formed or disposed on bottom support plate 104. A first passivation layer 306 is formed or disposed over at least a portion of gate electrode layer 304. In one embodiment, first passivation layer 306 includes a layer of silicon nitride or a layer of silicon dioxide deposited on gate electrode layer 304. A silicon semiconductor layer 307, e.g., a silicon semiconductor layer including an active amorphous silicon layer, is formed or disposed on first passivation layer 306 over a portion of gate electrode layer 304, e.g., over gate 305. A second metal layer 308 is formed or disposed on or over first passivation layer 306 and at least a portion of silicon semiconductor layer 307. Second metal layer 308 forms a source 309 and a drain 310 of TFT structure 302. In example embodiments, a second passivation layer 312, e.g., a passivation layer comprising silicon nitride or silicon dioxide, is formed or disposed on or over silicon semiconductor layer 307 and a portion of second metal layer 308.

In example embodiments, reflective layer 116 is formed on or over second passivation layer 312. A via 313 is formed through second passivation layer 312 and extends through a thickness of second passivation layer 312 to electrically couple a pixel electrode of reflective layer 116 to second metal layer 308 of TFT structure 302 associated with electrowetting pixel 102. More specifically, a portion of reflective layer 116 extends through via 313 to contact second metal layer 308 to electrically couple reflective layer 116 to second metal layer 308. As shown in FIGS. 5-7, in example embodiments, via 313 is positioned within the pixel region under elevated surface 300. With via 313 positioned under elevated surface 300, a likelihood of a secondary initiation point resulting from the formation of via 313 is reduced or eliminated.

A suitable barrier layer, such as barrier layer 120, is formed on reflective layer 116. In example embodiments, an organic layer 314, e.g., an organic material, is formed or disposed on or over a portion of barrier layer 120 formed over via 313. In one embodiment, organic layer 314 includes a polymer photoresist material. Organic layer 212 may include any suitable organic material including, without limitation, a polyacrylate material, an epoxy material, a polyimide material, and combinations thereof. In example embodiments, organic layer 314 has a dielectric constant greater than a dielectric constant of first liquid 130, e.g., an electrowetting oil, disposed in electrowetting pixel 102 and, in certain embodiments, the dielectric constant of organic layer 314 is at least 0.5 greater than the dielectric constant of first liquid 130. Suitable organic materials for organic layer 314 include, without limitation, a polyacrylate, an epoxy, or a polyamide material and combinations thereof.

Organic layer 314 forms elevated surface 300 positioned at a height h above a first surface of barrier layer 120 contacting hydrophobic layer 122, as shown in FIG. 7. Referring to FIG. 7, a first portion 316 of hydrophobic layer 122 is disposed on a first or top surface 317 of barrier layer 120 and a second portion 318 of hydrophobic layer 122 is formed on elevated surface 300 of organic layer 314 at a distance above first surface 317 of barrier layer 120, and a primary initiation point is formed under second portion 318 of hydrophobic layer 122.

In certain embodiments, organic layer 314 has a thickness greater than 0.5 micrometer. For example, in an example embodiment, pixel wall 108 within the associated pixel region at least partially forming a perimeter of electrowetting pixel 102 has a height from the first or top surface of barrier layer 120 to an opposite end of pixel wall 108 of 2.0 micrometers to 5.0 micrometers, and organic layer 314 has a thickness or is positioned at a height above the first surface of barrier layer 120, i.e., height h, equal to ⅓ of the height of pixel wall 108 to ⅔ of the height of pixel wall 108. In particular embodiments, the thickness of organic layer 314 is 0.66 micrometer to 3.33 micrometers and, more particularly, 1.0 micrometer to 2.0 micrometers. In certain embodiments, a planarization layer 316, as shown in FIG. 7, is deposited on organic layer 314, e.g., between organic layer 314 and hydrophobic layer 122, to provide a smooth, flat surface. In example embodiments, via 313 is positioned directly under elevated surface 300, i.e., organic layer 314 forming a primary initiation point or area within associated pixel 102. The layers disposed over reflective layer 116 and via 313 provide a smooth bottom surface of associate pixel 102 with little indentation or dimpling formed on the bottom surface of electrowetting pixel 102 resulting from the via formation, thereby reducing a likelihood of a secondary initiation point forming within electrowetting pixel 102 and enhancing oil movement within electrowetting pixel 102.

In one embodiment as shown in FIG. 7, for example, elevated surface 300 is positioned within a first portion of the pixel region, such as under at least a portion of a first pixel wall 108a, and TFT structure 302 is positioned within a second portion of the pixel region at a distance from the first portion of the pixel region, such as under at least a portion of a second pixel wall 108b positioned on an opposite side of electrowetting pixel 102 from first pixel wall 108a.

Referring further to FIG. 6, for example, with second or top support plate 114 coupled to bottom support plate 104 with pixel region between bottom support plate 104 and top support plate 114, first liquid 130, e.g., an electrowetting oil, is disposed in electrowetting pixel 102. Second liquid 132, e.g., an electrolyte solution, which is immiscible with first liquid 130, is initially disposed in the pixel region. TFT structure 202 (shown in FIGS. 1 and 2) is coupled to common electrode 112 (shown in FIGS. 1 and 2) for creating a voltage differential between TFT structure 202 and common electrode 112 to cause movement of first liquid 130 within electrowetting pixel 102 away from elevated surface 300 to expose a portion of reflective layer 116.

In an example embodiment, an electrowetting display device includes a first support plate and a second support plate opposite to the first support plate. An electrowetting pixel region is between the first support plate and the second support plate. A thin film transistor (TFT) structure is formed in the electrowetting pixel region and over the first support plate. The TFT structure includes a first metal layer over the first support plate. The first metal layer includes a gate. A first passivation layer is disposed over on the first metal layer and a silicon semiconductor layer is disposed on the first passivation layer. A second metal layer is disposed on the silicon semiconductor layer. The second metal layer includes a source and a drain. A second passivation layer is disposed on the second metal layer. The second passivation layer includes a via extending through a thickness of the second passivation layer. A reflective layer is disposed on the passivation layer. The reflective layer includes a pixel electrode. A portion of the reflective layer extends through the via to couple the pixel electrode to the drain of the second metal layer. A barrier layer is disposed on the reflective layer. An organic material or an organic layer is disposed on a portion of the barrier layer over the via. The organic material or layer forms an elevated surface above the portion of the barrier layer. A hydrophobic layer is disposed on the barrier layer and the organic layer. In a particular embodiment, a first portion of the hydrophobic layer is disposed on a first surface of the barrier layer and a second portion of the hydrophobic layer is formed on the elevated surface of the organic layer at a distance above the first surface of the barrier layer. A primary initiation point is formed under the second portion of the hydrophobic layer. A pixel wall is within the pixel region. The pixel wall has a height between the first surface of the barrier layer and an opposite end of the pixel wall, wherein the elevated surface of the organic layer is positioned at a height above the first surface of barrier layer equal to ⅓ of the height of the pixel wall to ⅔ of the height of the pixel wall.

In an example embodiment, a display device includes a first support plate and an opposing second support plate. A pixel region is between the first support plate and the second support plate. A thin film transistor (TFT) structure is disposed on the first support plate and associated with the pixel region. The TFT structure includes a source and drain electrode layer over the first support plate. A reflective layer is disposed over the source and drain electrode layer. The reflective layer includes a pixel electrode within the pixel region. A via is between the source and drain electrode layer and the reflective layer. The via electrically couples the pixel electrode to the source and drain electrode layer. An organic layer is disposed over the via. The organic layer includes an elevated surface over the via. The TFT structure may include a passivation layer on the source and drain electrode layer. The via extends through a thickness of the passivation layer, wherein a portion of the reflective layer extends through the via to contact the source and drain electrode layer. In one embodiment, the organic layer has a thickness greater than 0.5 micrometer. A barrier layer may be disposed on the reflective layer between the reflective layer and the organic layer, wherein the organic layer is disposed on a portion of the barrier layer over the via. A hydrophobic layer is disposed on the barrier layer and the organic layer. The hydrophobic layer forms a bottom surface of the pixel. A first portion of the hydrophobic layer is disposed on a first surface of the barrier layer and a second portion of the hydrophobic layer is formed on the elevated surface of the organic layer at a distance above the first surface of the barrier layer, and a primary initiation point is formed under the second portion of the hydrophobic layer. A pixel wall within the pixel region has a height between the first surface of the barrier layer and an opposite end of the pixel wall, wherein the elevated surface of the organic layer is positioned at a height above the first surface of barrier layer equal to ⅓ of the height of the pixel wall to ⅔ the height of the pixel wall. The TFT structure may also include a gate electrode layer disposed on the first support plate, a passivation layer over the gate electrode layer, and a silicon semiconductor layer over the passivation layer and under the source and drain electrode layer. A first pixel wall portion within the pixel region may be positioned over a portion of the elevated surface, wherein the elevated surface is positioned adjacent the first pixel wall portion and the TFT structure is positioned adjacent a second pixel wall portion within the pixel region opposite the first pixel wall portion.

Figure 8:
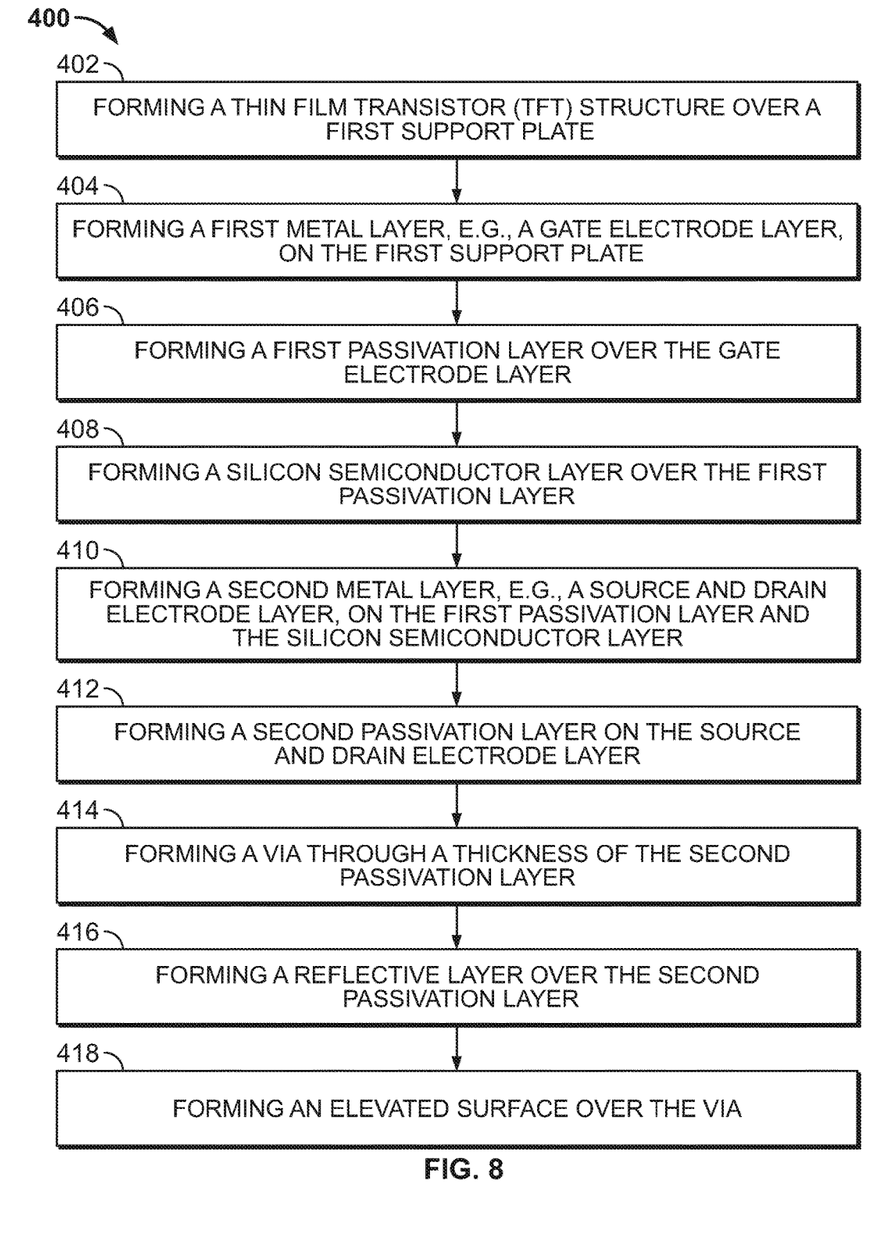
FIG. 8 is a flow chart depicting a method for fabricating an electrowetting display device, according to an example embodiment.

FIG. 8 is a flowchart illustrating an example method 400 for fabricating a display device, for example electrowetting display device 100 as described in FIGS. 1-7. At 402, a plurality of TFT structures, e.g., TFT structure 110 or 302, is formed over a first support plate, such as bottom support plate 104. Each TFT structure is associated with a respective pixel region, e.g., positioned within a respective pixel region and associated with a pixel within the respective pixel region formed over the first support plate. In the example embodiment, the pixel includes an elevated area or surface as described herein. In one embodiment, forming 402 the TFT structure includes forming 404 a first metal layer, e.g., a gate electrode layer, including a gate on or over the first support plate. A first passivation layer, such as a silicon nitride or silicon dioxide layer, is formed 406 over, e.g., on, the first metal layer and a silicon semiconductor layer is formed 408 on the first passivation layer between the first passivation layer and a second metal layer, e.g., a source and drain electrode layer, including a source and a drain of the TFT structure formed 410 on the first passivation layer and the silicon semiconductor layer. In certain embodiments, the elevated surface is positioned within a first portion of the pixel region, e.g., near or adjacent a first pixel wall portion 108a, and the TFT structure is positioned within a second portion of the pixel region e.g., near or adjacent a second pixel wall portion 108 be opposite first pixel wall portion 108a, at a distance from the first portion, such as described above.

A second passivation layer, such as a layer of silicon nitride or silicon dioxide, is formed 412, e.g., deposited, on or over the second metal layer, e.g., the source and drain electrode layer, and the silicon semiconductor layer. A via is formed 414 through a thickness of the second passivation layer. In one embodiment, the second passivation layer is patterned and developed to form a via through the thickness of the second passivation layer. In example embodiments, the via is positioned under the elevated surface as described herein. A reflective layer including a pixel electrode is formed 416 over the second metal layer of the TFT structure, e.g., on or over the second passivation layer. In one embodiment, a portion of the reflective layer is formed within the via to electrically couple the pixel electrode to the reflective layer to the source and drain electrode layer of the TFT structure. An elevated surface is formed 418 over the via. In one embodiment, a pixel having an elevated surface is formed over the reflective layer and a hydrophobic layer forms at least a portion of a bottom surface of the pixel. The elevated surface is positioned over the via and the TFT structure is associated with the pixel.

More specifically, in example embodiments, forming 418 an elevated surface over the via includes forming a barrier layer on the reflective layer. An organic layer is formed on a portion of the barrier layer over the via. In one embodiment, an organic photoresist material is disposed or deposited on a portion of the barrier layer over the via and the organic photoresist material is patterned using a suitable mask and developed to form the elevated surface of the pixel above the barrier layer. In example embodiments, the organic layer over the via has a dielectric constant greater than a dielectric constant of a first liquid disposed in the pixel, e.g., an oil, and has a thickness greater than 0.5 micrometer. In a particular embodiment, the organic layer has a thickness of 1.0 micrometer to 2.0 micrometers. A hydrophobic layer is then formed on the barrier layer and the organic material to form a bottom surface of the pixel. In example embodiments, forming a hydrophobic layer on the barrier layer and the organic material includes forming a first portion of the hydrophobic layer on a first surface of the barrier layer and forming a second portion of the hydrophobic layer on the elevated surface of the organic layer at a distance above the first surface of the barrier layer. In an example embodiment, the pixel wall at least partially forming the perimeter of the electrowetting pixel has a height from a first or top surface of the barrier layer to an opposite end of pixel wall 108 of 2.0 micrometers to 5.0 micrometers, and organic layer 314 has a thickness above the top surface of the barrier layer, i.e., height h, equal to ⅓ of the height of the pixel wall to ⅔ of the height of the pixel wall. In particular embodiments, the thickness of organic layer 314 is 0.66 micrometer to 3.33 micrometers and, more particularly, 1.0 micrometer to 2.0 micrometers.

In an example embodiment, a method for fabricating an electrowetting display device includes forming a thin film transistor (TFT) structure over a first support plate. Forming a TFT structure over a first support plate includes forming a source and drain electrode layer within a pixel region. A passivation layer on the source and drain electrode layer. A via is formed through a thickness of the passivation layer. A reflective layer is formed over the passivation layer. The reflective layer includes a pixel electrode. An elevated surface is formed over the via. In one embodiment, forming a reflective layer over the passivation layer includes forming a portion of the reflective layer within the via to electrically couple the pixel electrode in the reflective layer to the source and drain electrode layer. In one embodiment, forming an elevated surface over the via includes forming a barrier layer on the reflective layer, forming an organic layer on a portion of the barrier layer over the via, the organic layer forming the elevated surface above the barrier layer, and forming a hydrophobic layer on the barrier layer and the organic material, the hydrophobic layer forming a bottom surface of a pixel within the pixel region. Forming an organic layer on a portion of the barrier layer over the via may include forming an organic layer over the via with a dielectric constant greater than a dielectric constant of a first liquid disposed in the pixel and having a thickness greater than 0.5 micrometer. Forming a hydrophobic layer on the barrier layer and the organic material may include forming a first portion of the hydrophobic layer on a first surface of the barrier layer and forming a second portion of the hydrophobic layer on the elevated surface of the organic layer at a distance above the first surface of the barrier layer. In one embodiment, forming a TFT structure includes forming a gate electrode layer on the first support plate, forming an additional passivation layer over the gate electrode layer, and forming a silicon semiconductor layer between the additional passivation layer and the source and drain electrode layer, wherein the source and drain electrode layer is coupled to the pixel electrode through the via.

Figure 9:
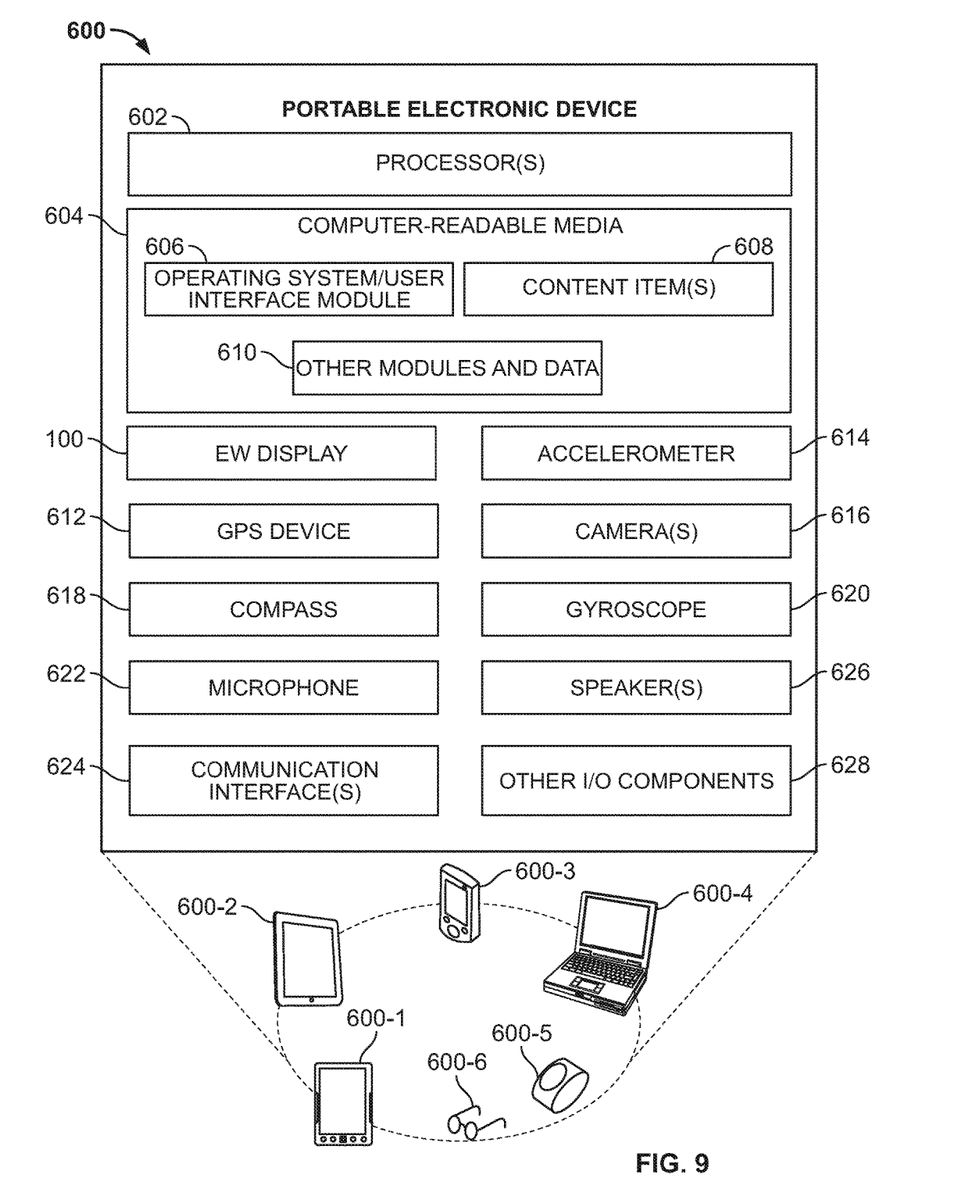
FIG. 9 illustrates example electrowetting display devices that may incorporate an electrowetting display, according to various embodiments.

FIG. 9 illustrates select example components of an example image display apparatus 500 that may be used with electrowetting display device 100 according to certain embodiments. Other types of displays may also be used with example image display apparatus 500. Such types of displays include, without limitation, LCDs, cholesteric displays, electrophoretic displays, electrofluidic pixel displays, photonic ink displays, and the like.

Image display apparatus 500 may be implemented as any of a number of different types of electronic devices. Some examples of the image display apparatus 500 may include digital media devices and eBook readers 500-1; tablet computing devices 500-2; smart phones, mobile devices and portable gaming systems 500-3; laptop and netbook computing devices 500-4; wearable computing devices 500-5; augmented reality devices, helmets, goggles or glasses 500-6; and any other device capable of connecting with electrowetting display device 100 and including a processor and memory for controlling the display according to the techniques described herein.

In a very basic configuration, image display apparatus 500 includes, or accesses, components such as at least one control logic circuit, central processing unit, or processor 502, and one or more computer-readable media 504. Each processor 502 may itself comprise one or more processors or processing cores. For example, processor 502 can be implemented as one or more microprocessors, microcomputers, microcontrollers, digital signal processors, central processing units, state machines, logic circuitries, and/or any devices that manipulate signals based on operational instructions. In some cases, processor 502 may be one or more hardware processors and/or logic circuits of any suitable type specifically programmed or configured to execute the algorithms and processes described herein. Processor 502 can be configured to fetch and execute computer-readable instructions stored in computer-readable media 504 or other computer-readable media. Processor 502 can perform one or more of the functions attributed to timing controller 202, source or source driver 204, and/or gate driver 206 of electrowetting display device 100. Processor 502 can also perform one or more functions attributed to a graphic controller (not illustrated) for the electrowetting display device.

Depending on the configuration of image display apparatus 500, computer-readable media 504 may be an example of tangible non-transitory computer storage media and may include volatile and nonvolatile memory and/or removable and non-removable media implemented in any type of technology for storage of information such as computer-readable instructions, data structures, program modules or other data. Computer-readable media 504 may include, but is not limited to, RAM, ROM, EEPROM, flash memory or other computer-readable media technology, CD-ROM, digital versatile disks (DVD) or other optical storage, magnetic cassettes, magnetic tape, solid-state storage and/or magnetic disk storage. Further, in some cases, image display apparatus 500 may access external storage, such as RAID storage systems, storage arrays, network attached storage, storage area networks, cloud storage, or any other medium that can be used to store information and that can be accessed by processor 502 directly or through another computing device or network. Accordingly, computer-readable media 504 may be computer storage media able to store instructions, modules or components that may be executed by processor 502.

Computer-readable media 504 may be used to store and maintain any number of functional components that are executable by processor 502. In some implementations, these functional components comprise instructions or programs that are executable by processor 502 and that, when executed, implement operational logic for performing the actions attributed above to image display apparatus 500. Functional components of image display apparatus 500 stored in computer-readable media 504 may include the operating system and user interface module 506 for controlling and managing various functions of image display apparatus 500, and for generating one or more user interfaces on electrowetting display device 100 of image display apparatus 500.

In addition, computer-readable media 504 may also store data, data structures and the like, that are used by the functional components. For example, data stored by computer-readable media 504 may include user information and, optionally, one or more content items 508. Depending on the type of image display apparatus 500, computer-readable media 504 may also optionally include other functional components and data, such as other modules and data 510, which may include programs, drivers and so forth, and the data used by the functional components. Further, image display apparatus 500 may include many other logical, programmatic and physical components, of which those described are merely examples that are related to the discussion herein. Further, while the figures illustrate the functional components and data of image display apparatus 500 as being present on image display apparatus 500 and executed by processor 502 on image display apparatus 500, it is to be appreciated that these components and/or data may be distributed across different computing devices and locations in any manner.

FIG. 9 further illustrates examples of other components that may be included in image display apparatus 500. Such examples include various types of sensors, which may include, for example, a GPS device 512, an accelerometer 514, one or more cameras 516, a compass 518, a gyroscope 520, and/or a microphone 522.

Image display apparatus 500 may further include one or more communication interfaces 524, which may support both wired and wireless connection to various networks, such as cellular networks, radio, Wi-Fi networks, close-range wireless connections, near-field connections, infrared signals, local area networks, wide area networks, the Internet, and so forth. Communication interfaces 524 may further allow a user to access storage on or through another device, such as a remote computing device, a network attached storage device, cloud storage, or the like.

Image display apparatus 500 may further be equipped with one or more speakers 526 and various other input/output (I/O) components 528. Such I/O components 528 may include, without limitation, a touchscreen and various user controls (e.g., buttons, a joystick, a keyboard, and/or a keypad), a haptic or tactile output device, connection ports, and/or physical condition sensors. For example, operating system 506 of image display apparatus 500 may include suitable drivers configured to accept input from a keypad, keyboard, or other user controls and devices included as I/O components 528. Additionally, image display apparatus 500 may include various other components that are not illustrated, examples of which include removable storage, a power source, such as a battery and power control unit, and a PC Card component.

Various instructions, methods and techniques described herein may be considered in the general context of computer-executable instructions, such as program modules stored on computer storage media and executed by the processors herein. Generally, program modules include routines, programs, objects, components, data structures, etc., for performing particular tasks or implementing particular abstract data types. These program modules, and the like, may be executed as native code or may be downloaded and executed, such as in a virtual machine or other just-in-time compilation execution environment. Typically, the functionality of the program modules may be combined or distributed as desired in various implementations. An implementation of these modules and techniques may be stored on computer storage media or transmitted across some form of communication.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications can be made, and equivalents can be substituted, without departing from claimed subject matter. Additionally, many modifications can be made to adapt a particular situation to the teachings of claimed subject matter without departing from the central concept described herein. Therefore, it is intended that claimed subject matter not be limited to the particular embodiments disclosed, but that such claimed subject matter can also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter can be practiced without these specific details. In other instances, methods, devices, or systems that would be known by one of ordinary skill have not been described in detail so as not to obscure claimed subject matter.

Reference throughout this specification to "one embodiment" or "an embodiment" can mean that a particular feature, structure, or characteristic described in connection with a particular embodiment can be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described can be combined in various ways in one or more embodiments. In general, of course, these and other issues can vary with the particular context of usage. Therefore, the particular context of the description or the usage of these terms can provide helpful guidance regarding inferences to be drawn for that context.

What is claimed is:

1. A display device, comprising:
   a first support plate and an opposing second support plate;
   a pixel region between the first support plate and the second support plate;
   a thin film transistor (TFT) structure on the first support plate and associated with the pixel region, the TFT structure comprising:
      a source and drain electrode layer over the first support plate;
      a reflective layer over the source and drain electrode layer, the reflective layer including a pixel electrode within the pixel region; and
      a via between the source and drain electrode layer and the reflective layer, the via electrically coupling the pixel electrode to the source and drain electrode layer;
   an organic layer disposed over the via and at least a portion of the reflective layer, the organic layer including an elevated surface over the via;
   a barrier layer on the reflective layer disposed between the reflective layer and the organic layer, wherein the organic layer is disposed on a portion of the barrier layer over the via; and
   a hydrophobic layer on the barrier layer and the organic layer, the hydrophobic layer forming a bottom surface of a pixel within the pixel region, wherein a first portion of the hydrophobic layer is disposed on a first surface of the barrier layer and a second portion of the hydrophobic layer is formed on the elevated surface of the organic layer at a distance above the first surface of the barrier layer, and a primary initiation point is formed under the second portion of the hydrophobic layer.

2. The display device of claim 1, wherein the TFT structure further comprises a passivation layer on the source and drain electrode layer, the via extending through a thickness of the passivation layer, wherein a portion of the reflective layer extends through the via to contact the source and drain electrode layer.

3. The display device of claim 1, wherein the organic layer has a thickness greater than 0.5 micrometer.

4. The display device of claim 1, further comprising a pixel wall within the pixel region, the pixel wall having a height between the first surface of the barrier layer and an opposite end of the pixel wall, wherein the elevated surface of the organic layer is positioned at a height above the first surface of the barrier layer equal to ⅓ of the height of the pixel wall to ⅔ of the height of the pixel wall.

5. The display device of claim 1, wherein the organic layer comprises a polyacrylate material, an epoxy material, a polyimide material, or a combination thereof.

6. The display device of claim 1, wherein the organic layer has a dielectric constant greater than a dielectric constant of a liquid disposed within the pixel region.

7. The display device of claim 1, wherein the TFT structure further comprises:
   a gate electrode layer disposed on the first support plate;
   a passivation layer over the gate electrode layer; and
   a silicon semiconductor layer over the passivation layer and under the source and drain electrode layer.

8. The display device of claim 1, further comprising a first pixel wall within the pixel region, the first pixel wall portion positioned over a portion of the elevated surface.

9. The display device of claim 8, wherein the elevated surface is positioned adjacent the first pixel wall portion and the TFT structure is positioned adjacent a second pixel wall portion within the pixel region opposite the first pixel wall portion.

10. An electrowetting display device, comprising:
    a first support plate;
    a pixel region over the first support plate;
    a thin film transistor (TFT) structure over the first support plate, the TFT structure including:
       a source and drain electrode layer within the pixel region;
       a passivation layer on the source and drain electrode layer;
       a via through a thickness of the passivation layer;
       a reflective layer over the passivation layer, the reflective layer including a pixel electrode; and
       a barrier layer on the reflective layer;
    an organic layer on a portion of the barrier layer over the via, the organic layer forming an elevated surface over the via; and
    a hydrophobic layer on the barrier layer and the organic layer, the hydrophobic layer forming a bottom surface of a pixel within the pixel region, wherein a first portion of the hydrophobic layer is disposed on a first surface of the barrier layer and a second portion of the hydrophobic layer is disposed on the elevated surface of the organic layer at a distance above the first surface of the barrier layer.

11. The electrowetting display device of claim 10, wherein a portion of the reflective layer within the via electrically couples the pixel electrode in the reflective layer to the source and drain electrode layer.

12. The electrowetting display device of claim 10, wherein the organic layer has a dielectric constant greater than a dielectric constant of a first liquid disposed in the pixel, the organic layer having a thickness greater than 0.5 micrometer.

13. The electrowetting display device of claim 10, further comprising:
    a gate electrode layer on the first support plate;
    an additional passivation layer over the gate electrode layer; and
    a silicon semiconductor layer between the additional passivation layer and the source and drain electrode layer, wherein the source and drain electrode layer is coupled to the pixel electrode through the via.

* * * * *